US006961356B2

(12) United States Patent
Brown

(10) Patent No.: US 6,961,356 B2
(45) Date of Patent: Nov. 1, 2005

(54) INTEGRATED WAVELENGTH COMBINER/LOCKER

(75) Inventor: Carlton D. Brown, Richardson, TX (US)

(73) Assignee: Alcatel, Paris (FR)

( * ) Notice: Subject to any disclaimer, the term of this patent is extended or adjusted under 35 U.S.C. 154(b) by 198 days.

(21) Appl. No.: 10/320,291

(22) Filed: Dec. 16, 2002

(65) Prior Publication Data

US 2004/0114852 A1 Jun. 17, 2004

(51) Int. Cl.$^7$ .............................. H01S 3/13; H01S 5/00
(52) U.S. Cl. ............................. 372/29.01; 372/29.02; 372/29.011; 372/50
(58) Field of Search ................. 372/29.01, 29.02, 372/29.011, 38.01, 50, 99, 102, 38.1

(56) References Cited

U.S. PATENT DOCUMENTS

| | | | | |
|---|---|---|---|---|
| 5,526,155 A | * | 6/1996 | Knox et al. | 398/87 |
| 5,777,763 A | | 7/1998 | Tomlinson | |
| 6,222,861 B1 | | 4/2001 | Gupta et al. | |
| 6,233,261 B1 | | 5/2001 | Weiss et al. | |
| 6,349,103 B1 | | 2/2002 | Jang et al. | |
| 6,411,634 B1 | | 6/2002 | Zhang et al. | |
| 6,477,190 B1 | | 11/2002 | Komiyama et al. | |
| 6,754,243 B2 | * | 6/2004 | Missey et al. | 372/20 |
| 6,822,983 B2 | * | 11/2004 | Minneman | 372/28 |
| 2003/0099425 A1 | * | 5/2003 | Grubb et al. | 385/14 |

OTHER PUBLICATIONS

U.S. Appl. No. 10/173,378, filed Jun. 17, 2002, Carlton D. Brown.
M. Shirasaki "Virtually Imaged Phased Array", FUJITSU Sci. Tech. J., 35, 1, pp. 113–125 (Jul., 1999).
Jason Huang "The Missing Link in Laser Stabilization" www.freespace.com, pp. 1–4, downloaded Nov. 6, 2002.

* cited by examiner

Primary Examiner—Minsun Oh Harvey
Assistant Examiner—Armando Rodriguez
(74) Attorney, Agent, or Firm—William J. Tucker; Jessica W. Smith; W. Lawrence Sewell

(57) ABSTRACT

An integrated wavelength combiner/locker is described herein that performs a multiplexing function of a wavelength combiner and a wavelength error measurement function of a wavelength locker. In the preferred embodiment, the integrated wavelength combiner/locker includes a filter (e.g., diffraction grating, glass plate) that receives multiple optical signals and outputs a multiplexed optical signal. The integrated wavelength combiner/locker also includes a partially reflective device (e.g., mirror, coupler/circulator) that directs a portion of the multiplexed optical signal back into the filter that splits the multiplexed optical signal back into individual optical signals. The integrated wavelength combiner/locker further includes one or more ordered pairs of photodetectors each of which receives one of the individual optical signals and is used to detect a wavelength error in that optical signal.

32 Claims, 6 Drawing Sheets

US 6,961,356 B2

INTEGRATED WAVELENGTH COMBINER/LOCKER

BACKGROUND OF THE INVENTION

1. Field of the Invention

The present invention relates in general to dense wavelength division multiplexing (DWDM) systems and, in particular, to a wavelength combiner (e.g., wavelength multiplexer) that has one or more wavelength lockers integrated therein.

2. Description of Related Art

Today, the inaccuracy and long term stability of wavelength lockers imposes one of the most significant limitations to the capacity achievable in a DWDM transmission system. Wavelength lockers are used to identify and correct wavelength errors in optical signals emitted from lasers. An exemplary DWDM system 100 incorporating traditional wavelength lockers 102 and the problems associated with the traditional wavelength lockers 102 are described below in FIG. 1.

Referring to FIG. 1 (PRIOR ART), there is a block diagram of the exemplary DWDM system 100 in which the traditional wavelength lockers 102 (only four shown) are not incorporated within a traditional wavelength combiner 104. The DWDM system 100 includes an output unit 106 (e.g., optical source 106) and an input unit 108. The output unit 106 includes one or more transmitters 110 (only four shown) that are connected to the wavelength combiner 104 (e.g., wavelength multiplexer 104). The input unit 108 includes one or more receivers 112 (only four shown) that are connected to a wavelength splitter 114 (e.g., wavelength demultiplexer 114). As shown, the transmitters 110 are connected to the wavelength combiner 104 which is connected via an optical fiber 120 to the wavelength splitter 114 that is connected to the receivers 112. Each receiver 112 includes an O/E device 118 (e.g., PIN or APD) and a CDR 120 that demodulates and outputs transmitted data (e.g., channel 1 data, channel 2 data . . . ).

Each transmitter 110 includes a laser 122, an internal or external modulator 124 (shown as an external modulator 124), a data source 126, a traditional wavelength locker 102, a feedback circuit 128 and a thermo-electric cooler (TEC) 130. As shown, each laser 122 (e.g., thermally tunable laser 122) is connected to an external modulator 124 (e.g., Mach-Zehnder modulator, electro-absorptive modulator). The external modulator 124 is connected to the data source 126 (e.g., channel 1 data, channel 2 data . . . ). Each laser 122 and external modulator 124 emit a modulated optical signal 132 (shown as $\lambda_1$, $\lambda_2$, $\lambda_3$ and $\lambda_n$) and towards one of the traditional wavelength lockers 102.

Each traditional wavelength locker 102 includes a splitter 134 (e.g., 95/5 splitter 134) that directs a large portion of the modulated optical signal 132 to the wavelength combiner 104 and a smaller portion of the modulated optical signal 132 to another splitter 136 (e.g., 50/50 splitter 136). The splitter 136 then directs a portion of the modulated optical signal 132 to an Etalon 138 and another portion or unfiltered version of the modulated optical signal 132 to photodetector 140a (e.g., PIN diode 140a). The Etalon 138 directs a filtered version of the modulated optical signal 132 to photodetector 140b (e.g., PIN diode 140b). The two photodetectors 140a and 140b output two electrical signals 142 to the feedback circuit 128. The feedback circuit 128 analyzes these electrical signals 142 that indicate whether or not there is a wavelength error and the magnitude of the wavelength error in the corresponding optical signal 132. If there is a wavelength error in the optical signal 132, then the feedback circuit 128 instructs the corresponding thermo-electric cooler 130 (e.g., Peltier Cooler) to adjust the corresponding laser 122 in order to correct the wavelength error in that optical signal 132.

The DWDM system 100 and the traditional wavelength lockers 102 described above are well known to those skilled in the art. Likewise, the problems associated with the traditional wavelength lockers 102 are also well known to those skilled in the art. The main problems associated with traditional wavelength lockers 102 are often attributable to the aging of the splitters 134 and 136, the Etalon 138 and the photodetectors 140a and 140b. The aging of these different components adversely affects the accuracy and sensitivity of traditional wavelength lockers 102 especially because any drift in accuracy will be largely independent from any drift occurring within the wavelength combiner 104. Thus, there is a need for a new design of a wavelength locker that can address the aforementioned shortcomings and other shortcomings of the traditional wavelength lockers 102. This need and other needs are addressed by the integrated wavelength combiner/wavelength locker of the present invention.

BRIEF DESCRIPTION OF THE INVENTION

The present invention includes an integrated wavelength combiner/locker that performs a multiplexing function of a wavelength combiner and a wavelength error correction function of a wavelength locker. In the preferred embodiment, the integrated wavelength combiner/locker includes a filter (e.g., diffraction grating, glass plate) that receives multiple optical signals and outputs a multiplexed optical signal. The integrated wavelength combiner/locker also includes a partially reflective device (e.g., mirror, coupler/circulator) that directs a portion of the multiplexed optical signal back into the filter that splits the multiplexed optical signal back into individual optical signals. The integrated wavelength combiner/locker further includes one or more ordered pairs of photodetectors each of which receives one of the individual optical signals and is used to detect a wavelength error in that optical signal.

BRIEF DESCRIPTION OF THE DRAWINGS

A more complete understanding of the present invention may be obtained by reference to the following detailed description when taken in conjunction with the accompanying drawings wherein.

DETAILED DESCRIPTION OF THE DRAWINGS

Figure 1:
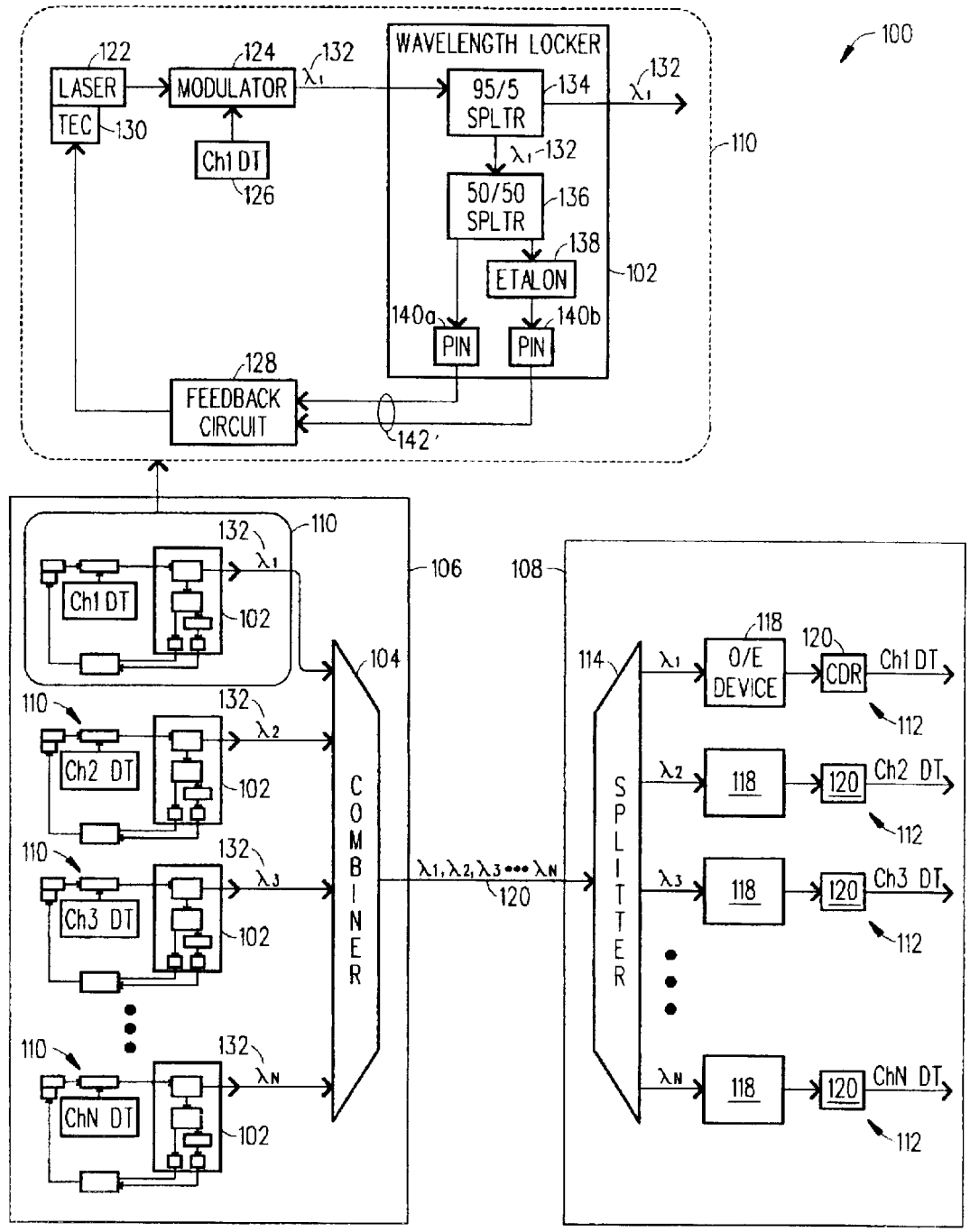
FIG. 1 (PRIOR ART) is a block diagram of an exemplary DWDM system in which traditional wavelength lockers are not incorporated within a traditional wavelength combiner.
Figure 2:
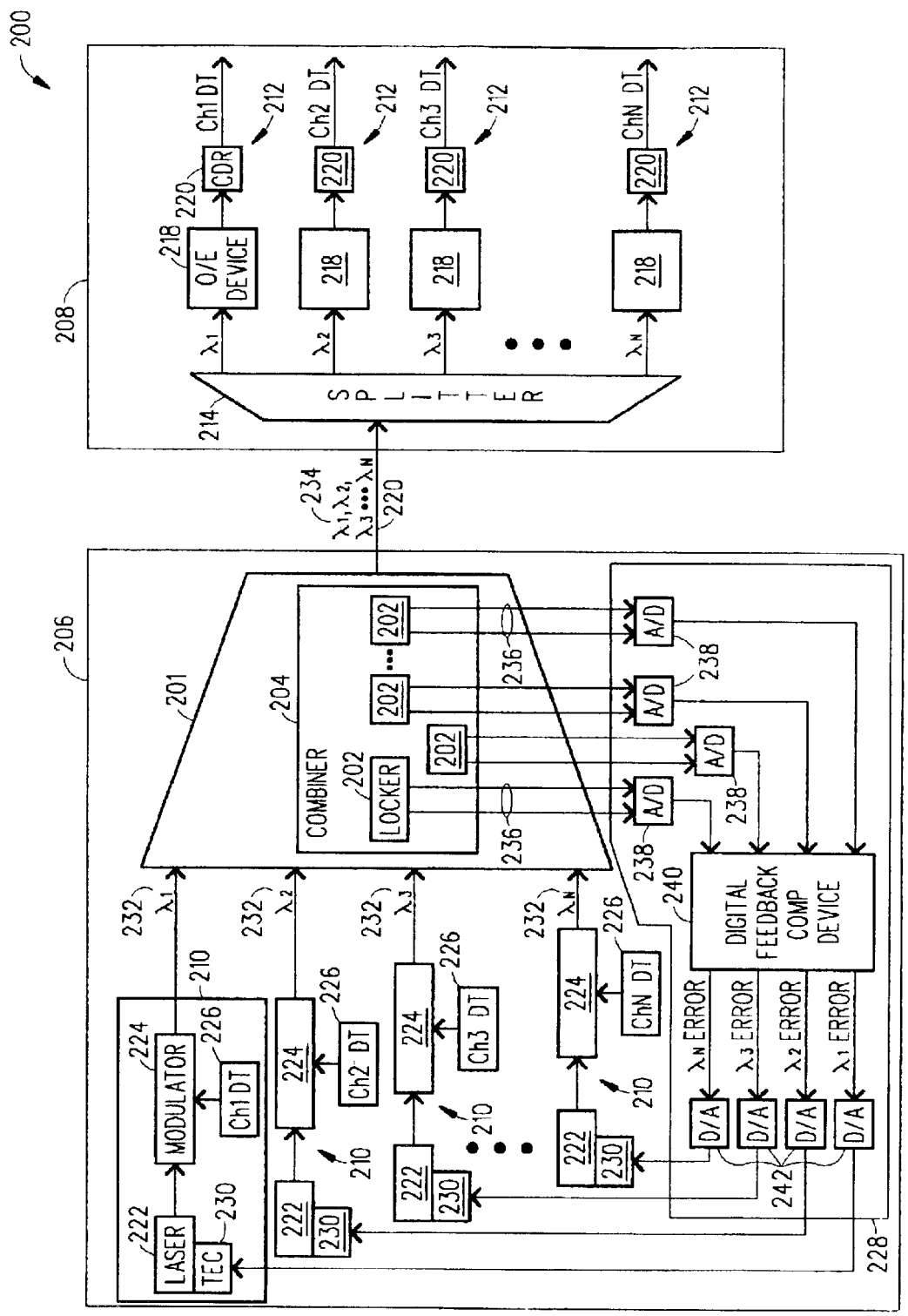
FIG. 2 is a block diagram of an exemplary DWDM system in which wavelength lockers are incorporated within a wavelength combiner to form an integrated wavelength combiner/locker in accordance with the present invention.

Referring to FIG. 2, there is a block diagram of an exemplary DWDM system 200 in which wavelength lockers 202 are incorporated within a wavelength combiner 204 to form an integrated wavelength combiner/locker 201 in accordance with the present invention. Certain details and components associated with the DWDM system 200 besides the integrated wavelength combiner/locker 201 are well known to those skilled in the art. Therefore, for clarity, the description provided below in relation to the DWDM system 200 omits those components not necessary to understand the integrated wavelength combiner/locker 201.

The DWDM system 200 includes an output unit 206 (e.g., optical source 206) and an input unit 208. The output unit 206 includes one or more transmitters 210 (only four shown) that are connected to the integrated wavelength combiner/locker 201. The integrated wavelength combiner/locker 201 includes a wavelength combiner 204 (e.g., wavelength multiplexer 204) and one or more wavelength lockers 202 (only four shown). The input unit 208 includes one or more receivers 212 (only four shown) that are connected to a wavelength splitter 214 (e.g., wavelength demultiplexer 214). As shown, the transmitters 210 are connected to the integrated wavelength combiner/locker 201 which is connected via an optical fiber 220 to the wavelength splitter 214 that is connected to the receivers 212. Each receiver 212 includes an O/E device 218 (e.g., PIN or APD) and a CDR 220 that demodulates and outputs transmitted data (e.g., channel 1 data, channel 2 data . . . ).

Each transmitter 210 includes a laser 222, an internal or external modulator 224 (shown as an external modulator 124), a data source 226, a feedback circuit 228 and a thermo-electric cooler (TEC) 230. As shown, each laser 222 (e.g., thermally tunable laser 222) is connected to an external modulator 224 (e.g., Mach-Zehnder modulator, electro-absorptive modulator). The external modulator 224 is connected to the data source 226 (e.g., channel 1 data, channel 2 data . . . ). Each laser 222 and external modulator 224 emit a modulated optical signal 232 (shown as $\lambda_1, \lambda_2, \lambda_3$ and $\lambda_n$) towards the integrated wavelength combiner/locker 201.

The integrated wavelength combiner/locker 201 performs the multiplexing function of the wavelength combiner 204 by receiving multiple optical signals 232 and outputting a multiplexed optical signal 234 (shown as $\lambda_1, \lambda_2, \lambda_3$ and $\lambda_n$) to the wavelength splitter 214. In addition, the integrated wavelength combiner/locker 201 performs the wavelength error measurement functions of wavelength lockers 202 by outputting multiple pairs of electrical signals 236 (only four shown) to the feedback circuit 228. The feedback circuit 228 analyzes each pair of electrical signals 236 that indicate whether or not there is a wavelength error and both the magnitude and the sign of the wavelength error in the corresponding optical signal 232. If there is a wavelength error in one of the optical signals 232, then the feedback circuit 228 instructs the corresponding thermo-electric cooler 230 (e.g., Peltier Cooler) to adjust the temperature of the corresponding laser 222 in order to correct the wavelength error in that optical signal 232. The feedback circuit 228 includes analog-digital (A/Ds) converters 238, a digital feedback compensation device 240 and digital-analog (D/As) converters 242. Four different embodiments of the integrated wavelength combiner/locker 201 are described in detail below with respect to FIGS. 3–6.

Figure 3:
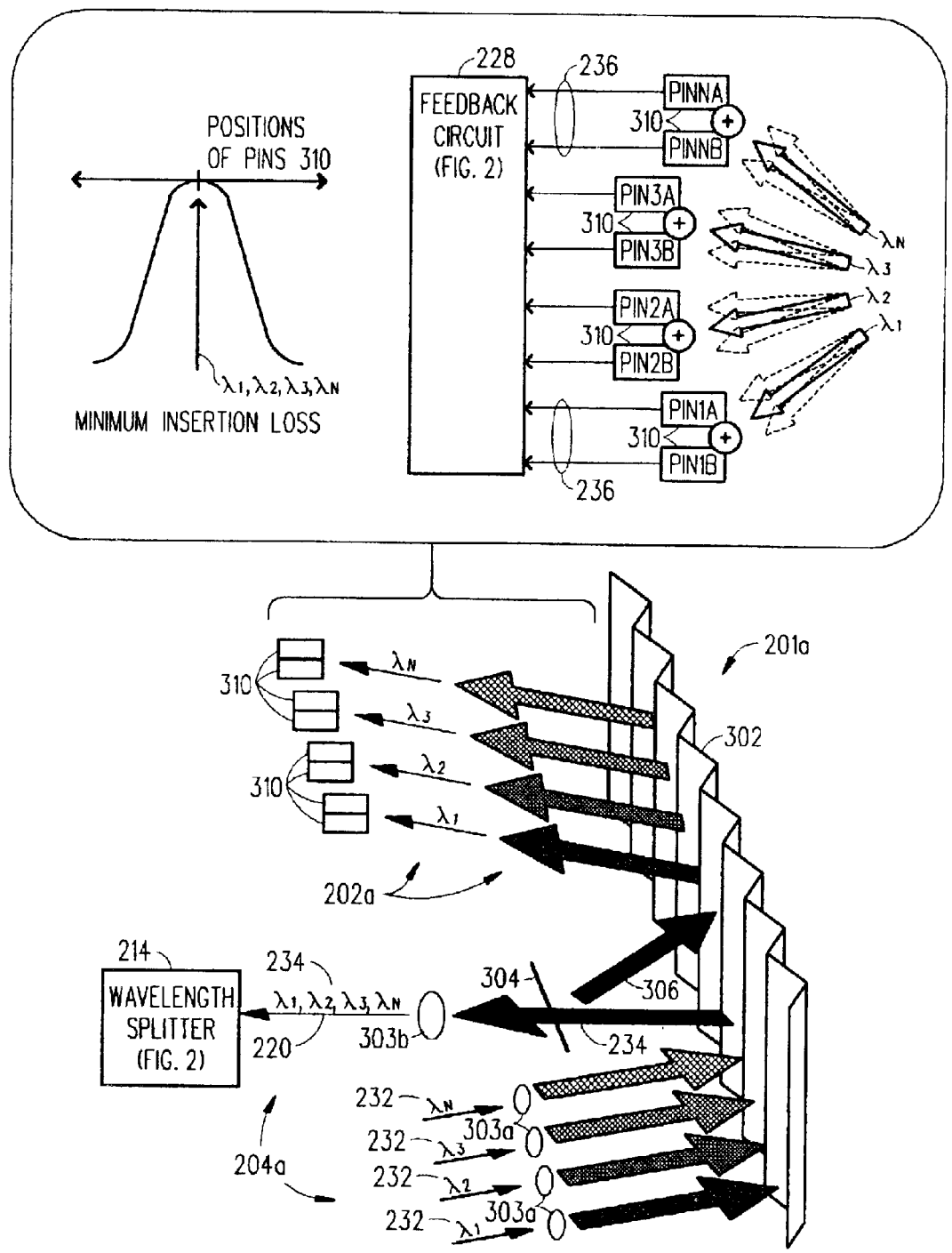
FIG. 3 is a diagram of a first embodiment of the integrated wavelength combiner/locker shown in FIG. 2.

Referring to FIG. 3, there is shown a diagram of a first embodiment of the integrated wavelength combiner/locker 201a. In this embodiment, the wavelength combiner 204a is a reflective diffraction grating based wavelength combiner 204a.

The integrated wavelength combiner/locker 201a includes a filter 302 (e.g., reflective diffraction grating) that receives several independent modulated optical signals 232 (shown as $\lambda_1, \lambda_2, \lambda_3$ and $\lambda_n$) each of which has passed through a collimating lens 303a. The filter 302 outputs or reflects therefrom a multiplexed optical signal 234 (shown as $\lambda_1, \lambda_2, \lambda_3 \ldots \lambda_n$) which has also passed through a collimating lens 303b. The multiplexed optical signal 234 is transmitted on the optical fiber 220 towards the wavelength splitter 214 (see FIG. 2). The integrated wavelength combiner/locker 201a also includes a partially reflective device 304 (e.g., mirror, coupler/circulator). The partially reflective device 304 directs a portion of the multiplexed optical signal 234 shown as a reflected optical signal 306 back into the filter 302. The filter 302 then splits or demultiplexes the reflected optical signal 306 back into individual optical signals 232 (shown as $\lambda_1, \lambda_2, \lambda_3$ and $\lambda_n$). The demultiplexed optical signals 232 are directed towards pairs of photodetectors 310 (shown as PIN1A&B, PIN2A&B, PIN3A&B and PIN4A&B). Each pair of photodetectors 310 outputs a pair of electrical signals 236 to the feedback circuit 228 (see FIG. 2). The feedback circuit 228 analyzes each pair of electrical signals 236 which indicate whether or not there is a wavelength error and both the magnitude and sign of the wavelength error in the corresponding optical signal 232. If there is a wavelength error in one of the optical signals 232, then the feedback circuit 228 instructs the corresponding thermo-electric cooler 230 (e.g., Peltier Cooler) to adjust the temperature of the corresponding laser 222 in order to correct the wavelength error in that optical signal 232.

Each photodetector of a pair of photodetectors 310 is positioned on either side of a region of maximum constructive interference that corresponds to an ideal wavelength value of one of the optical signals 232. As shown, the "solid" optical signals 232 indicate the regions of maximum constructive interference or minimum insertion loss that corresponds to the ideal wavelength values of those optical signals 232. If the wavelength of one of the optical signals 232 is equal to its ideal value, then the region of maximum constructive interference will fall between the pair of photodetectors 310, exposing each photodetector to a substantially equal amount of light. Thus, the corresponding pair of photodetectors 310 would output electrical signals 236 that are substantially equal to one another which indicates that there is little or no wavelength error in that optical signal 232 (see "+" on graph in FIG. 3). In this case, the feedback circuit 228 would analyze the electrical signals 236 and determine there is little to no wavelength error in the corresponding optical signal 232. Thus, the feedback circuit 228 would not need to instruct the corresponding thermo-electric cooler 230 to adjust the corresponding laser 222.

In contrast, if the wavelength of one of the optical signals 232 is not equal to its ideal value, then the region of maximum constructive interference will move as shown by the dashed optical signals 232 to expose one of the photodetectors (e.g. PIN1A) to more light than its partner (e.g. PIN1B) within the pair 310. Then that pair of photodetectors 310 would output two electrical signals 236 that are different from one another which indicates there is a wavelength error and this difference indicates both the magnitude and the sign of the wavelength error in that optical signal 232. In other words, if one of the optical signals 232 deviates from its ideal wavelength then one of the photodetectors 310 (e.g., PIN1A) is going to receive more light than the other photodetector 310 (e.g., PIN 1B). This situation causes the photodetectors 310 (e.g., PIN1A&B) to produce different electrical signals 236. In this case, the feedback circuit 228 would analyze the differential electrical signals 236 and determine the magnitude and the sign of the wavelength error in the corresponding optical signal 232 (see FIG. 2). Thereafter, the feedback circuit 228 would instruct the corresponding thermo-electric cooler 230 to adjust the corresponding laser 222 to increase or decrease its wavelength to correct the wavelength error in that optical signal 232.

Figure 4:
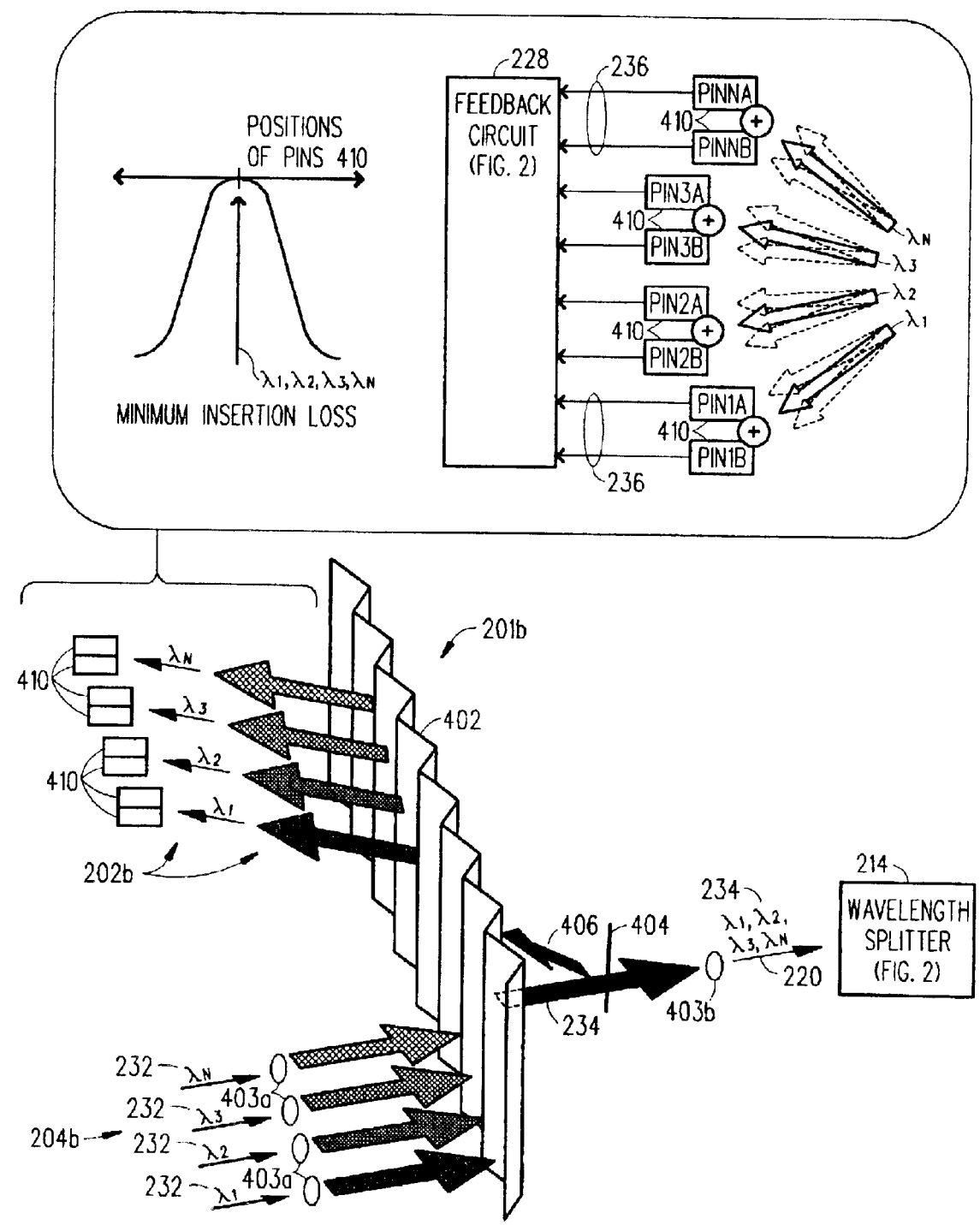
FIG. 4 is a diagram of a second embodiment of the integrated wavelength combiner/locker shown in FIG. 2.

Referring to FIG. 4, there is shown a diagram of a second embodiment of the integrated wavelength combiner/locker 201b. In this embodiment, the wavelength combiner 204b is a transmissive diffraction grating based wavelength combiner 204b.

The integrated wavelength combiner/locker 201b includes a filter 402 (e.g., transmissive diffraction grating) that receives several independent modulated optical signals 232 (shown as $\lambda_1, \lambda_2, \lambda_3$ and $\lambda_n$) each of which has passed through a collimating lens 403a. The filter 402 outputs a multiplexed optical signal 234 (shown as $\lambda_1, \lambda_2, \lambda_3 \ldots \lambda_n$) which has also passed through a collimating lens 403b. The multiplexed optical signal 234 is transmitted on the optical fiber 220 towards the wavelength splitter 214 (see FIG. 2). The integrated wavelength combiner/locker 201b also includes a partially reflective device 404 (e.g., mirror, coupler/circulator). The partially reflective device 404 directs a portion of the multiplexed optical signal 234 shown as a reflected optical signal 406 back into and through the filter 402. The filter 402 splits or demultiplexes the reflected optical signal 406 back into individual optical signals 232 (shown as $\lambda_1, \lambda_2, \lambda_3$ and $\lambda_n$). The demultiplexed optical signals 232 are directed towards pairs of photodetectors 410 (shown as PIN1A&B, PIN2A&B, PIN3A&B and PIN4A&B). Each pair of photodetectors 410 outputs a pair of electrical signals 236 to the feedback circuit 228. The feedback circuit 228 analyzes each pair of electrical signals 236 which indicate whether or not there is a wavelength error. The difference between the two signals within each pair of electrical signals 236 indicates both the magnitude and the sign of the wavelength error in the corresponding optical signal 232. If there is a wavelength error in one of the optical signals 232, then the feedback circuit 228 instructs the corresponding thermo-electric cooler 230 (e.g., Peltier Cooler) to adjust the temperature of the corresponding laser 222 in order to correct the wavelength error in that optical signal 232.

Each photodetector of a pair of photodetectors 410 is positioned on either side of a region of maximum constructive interference that corresponds to an ideal wavelength value of one of the optical signals 232. As shown, the "solid" optical signals 232 indicate the regions of maximum constructive interference or minimum insertion loss that corresponds to the ideal wavelength values of those optical signals 232. If the wavelength of one of the optical signals 232 is equal to its ideal value, then the region of maximum constructive interference will fall between the pair of photodetectors 410, exposing each photodetector to a substantially equal amount of light. Thus, the corresponding pair of photodetectors 410 would output electrical signals 236 that are substantially equal to one another which indicates that there is little or no wavelength error in that optical signal 232 (see "+" on the graph in FIG. 4). In this case, the feedback circuit 228 would analyze the electrical signals 236 and determine there is a minimum insertion loss or little to no wavelength error in the corresponding optical signal 232. The feedback circuit 228 would not need to instruct the corresponding thermo-electric cooler 230 to adjust the corresponding laser 222.

In contrast, if the wavelength of one of the optical signals 232 is not equal to its ideal value, then the region of maximum constructive interference as shown by the "solid" optical signal 232 will move to illuminate one photodetector 410 (e.g., PIN1A) more than the other photodetector 410 (e.g., PIN1B) as shown by the "dashed" optical signals 232. Then that pair of photodetectors 410 would output two electrical signals 236 that are different from one another which indicates both the magnitude of the wavelength error and also the sign of the wavelength error in that optical signal 232. In other words, if one of the optical signals 232 deviates from its ideal wavelength then one of the photodetectors 410 (e.g., PIN1A) is going to receive more light than the other photodetector 410 (e.g., PIN 1B). This situation causes the photodetectors 410 (e.g., PIN1A&B) to produce different electrical signals 236. In this case, the feedback circuit 228 would analyze the different electrical signals 236 and determine the magnitude and the sign of the wavelength error in the corresponding optical signal 232 (see FIG. 2). Thereafter, the feedback circuit 228 would instruct the corresponding thermo-electric cooler 230 to adjust the temperature of the corresponding laser 222 to increase or decrease its wavelength to correct the wavelength error in that optical signal 232.

Figure 5:
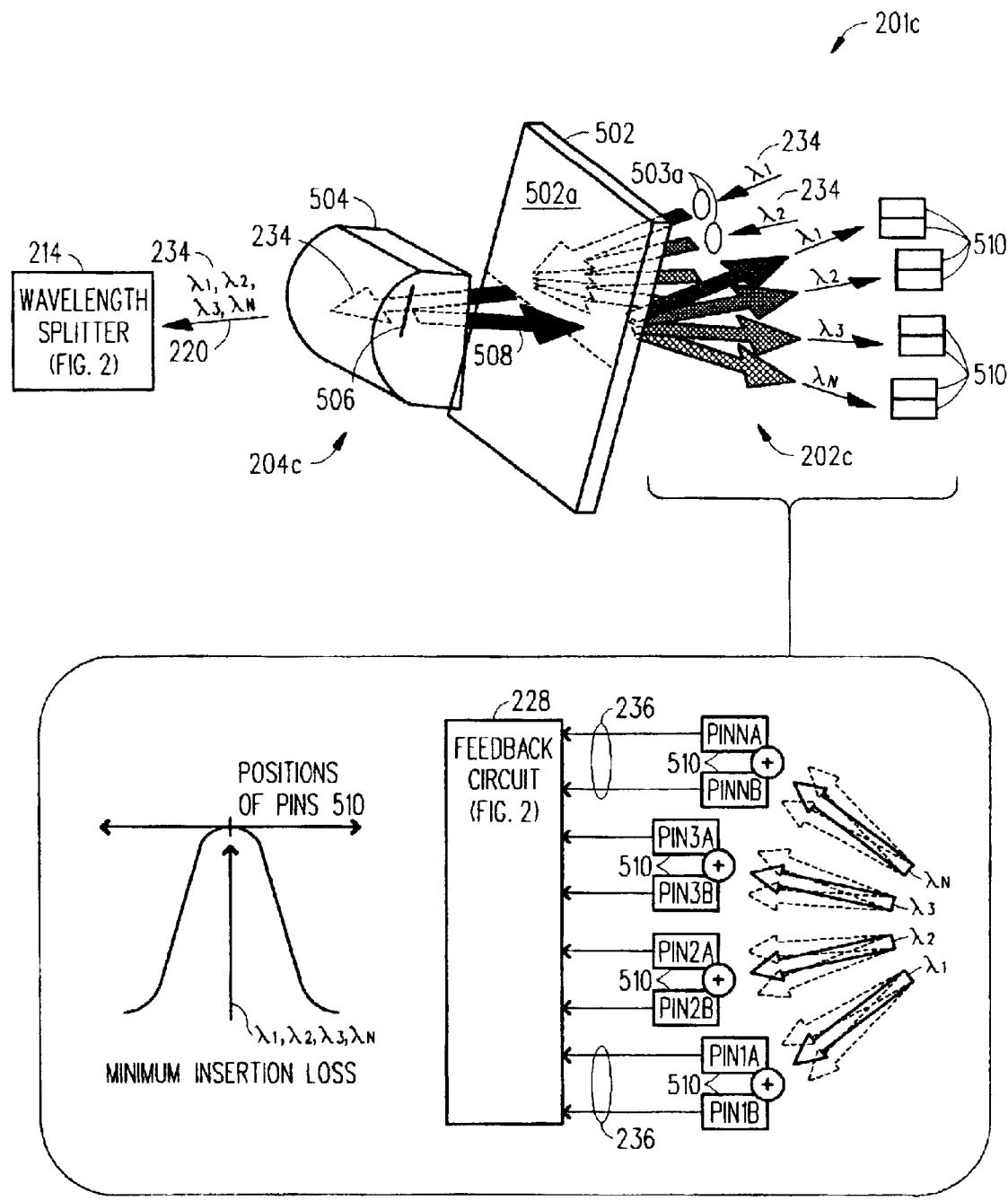
FIG. 5 is a diagram of a third embodiment of the integrated wavelength combiner/locker shown in FIG. 2.

Referring to FIG. 5, there is shown a diagram of a third embodiment of the integrated wavelength combiner/locker 201c. In this embodiment, a virtually imaged phased array (VIPA) is incorporated within the wavelength combiner 204c. Details about a VIPA used within a wavelength combiner can be found in an article by M. Shirasaki entitled "Virtually Imaged Phased Array" (FUJITSU Sci. Tech, J., 35, 1, pp.113–125, Jul. 1999). This article is incorporated by reference herein.

The integrated wavelength combiner/locker 201c includes a glass plate 502. The glass plate 502 receives several independent modulated optical signals 232 (shown as $\lambda_1, \lambda_2, \lambda_3$ and $\lambda_n$) on one side that is coated with a 100%-reflection film except in the light incident window which has an anti-reflection coat. The optical signals 232 come out the other side 502a of the glass plate 502 which is coated with a high-reflection film. The optical signals 232 are then passed through a semi-cylindrical lens 504 so as to form of a multiplexed optical signal 234 (shown as 80 $_1, \lambda_2, \lambda_3 \ldots \lambda_n$). The multiplexed optical signal 234 is transmitted on the optical fiber 220 towards the wavelength splitter 214 (see FIG. 2). The integrated wavelength combiner/locker 201c also includes a partially reflective device 506 (e.g., mirror, coupler/circulator). The partially reflective device 506 directs a portion of the multiplexed optical signal 234 shown as a reflected optical signal 508 back into and through the glass plate 502. The glass plate 502 splits or demultiplexes the reflected optical signal 508 back into individual optical signals 232 (shown as $\lambda_1, \lambda_2, \lambda_3$ and $\lambda_n$). The demultiplexed optical signals 232 are directed towards pairs of photodetectors 510 (shown as PIN1A&B, PIN2A&B, PIN3A&B and PIN4A&B). Each pair of photodetectors 510 outputs a pair of electrical signals 236 to the feedback circuit 228 (see FIG. 2). The feedback circuit 228 analyzes each pair of the electrical signals 236 which indicate whether or not there is a wavelength error and both the magnitude and the sign of the wavelength error in the corresponding optical signal 232. If there is a wavelength error in one of the optical signals 232, then the feedback circuit 228 instructs the corresponding thermo-electric cooler 230 (e.g., Peltier Cooler) to adjust the temperature of the corresponding laser 222 in order to correct the wavelength error in that optical signal 232.

Each photodetector of a pair of photodetectors 510 is positioned on either side of a region of maximum constructive interference or minimum insertion loss that corresponds to an ideal wavelength value of one or more optical signals 232. As shown, the "solid" optical signals 232 indicate the regions of maximum constructive interference that correspond to the ideal wavelength values of those optical signals 232. If the wavelength of one of the optical signals 232 is equal to its ideal value, then the region of maximum constructive interference will fall between the pair of photodetectors 510, exposing each photodetector to a substantially equal amount of light. Thus, the corresponding pair of photodetectors 510 would output electrical signals 236 that are substantially equal to one another which indicates that there is little or no wavelength error or minimum insertion loss in that optical signal 232 (see "+" on graph in FIG. 5). In this case, the feedback circuit 228 would analyze the electrical signals 236 and determine that there is minimum insertion loss or little to no wavelength error in the corresponding optical signal 232. The feedback circuit 228 would not need to instruct the corresponding thermo-electric cooler 230 to adjust the corresponding laser 222.

In contrast, if the wavelength of one of the optical signals 232 is not equal to its ideal value, then the region of maximum constructive interference as shown by the "solid" optical signal 232 will move as shown by the dashed optical signals 232 to expose one photodetector 510 (e.g., PIN1A) to more light than the other photodetector 510 (e.g., PIN1B) as shown by the "dashed" optical signals 232. Then that pair of photodetectors 510 would output two electrical signals 236 that are different from one another which indicates there is a wavelength error and this difference indicates both the magnitude and the sign of the wavelength error in that optical signal 232. In other words, if one of the optical signals 232 deviates from its ideal wavelength then one of the photodetectors 510 (e.g., PIN1A) is going to receive more light than the other photodetector 510 (e.g., PIN 1B). This situation causes the photodetectors 510 (e.g., PIN1A&B) to produce different electrical signals 236. In this case, the feedback circuit 228 would analyze the different electrical signals 236 and determine the magnitude and sign of the wavelength error in the corresponding optical signal 232 (see FIG. 2). Thereafter, the feedback circuit 228 would instruct the corresponding thermo-electric cooler 230 to adjust the corresponding laser 222 to increase or decrease its wavelength to correct the wavelength error in that optical signal 232.

Figure 6:
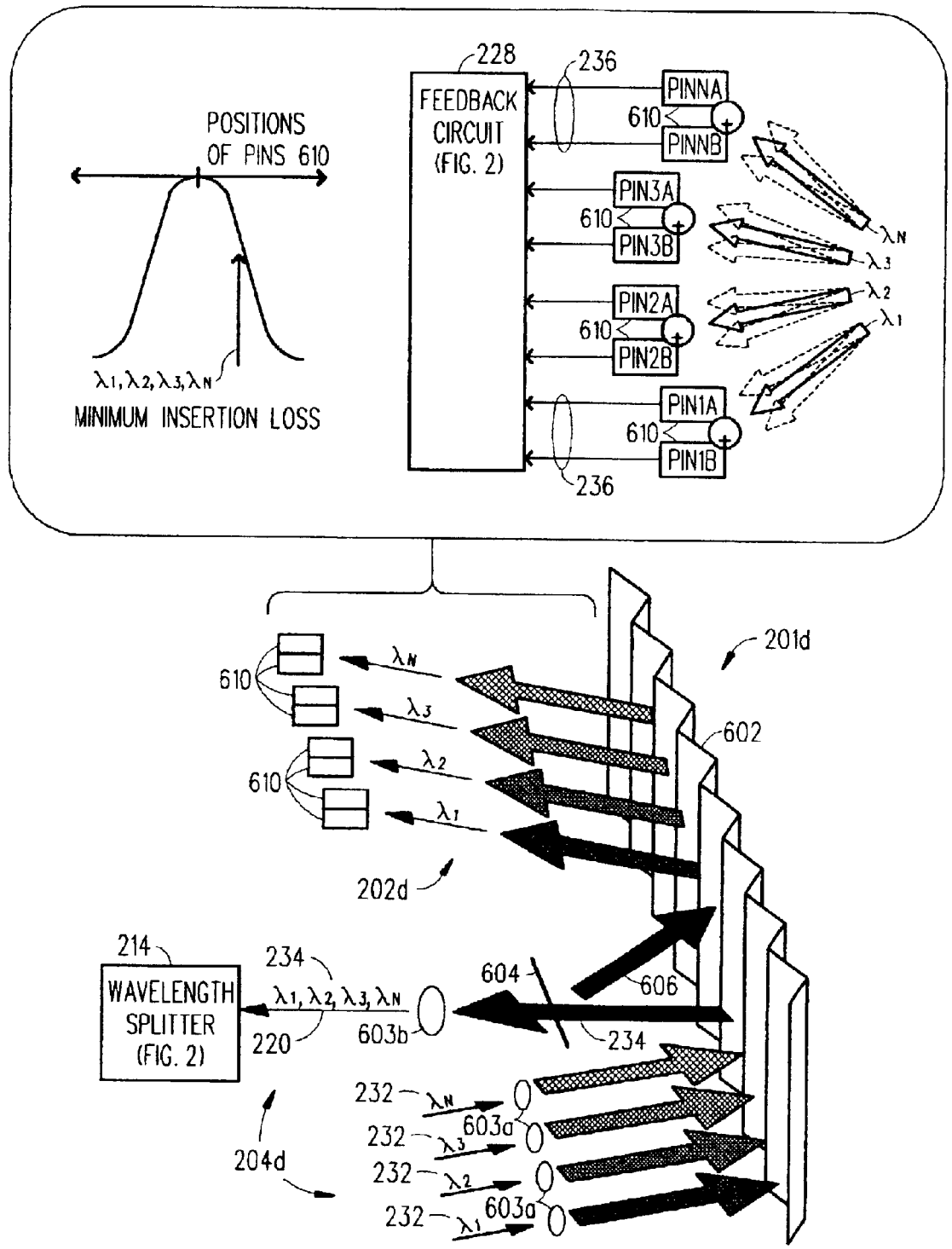
FIG. 6 is a diagram of a fourth embodiment of the integrated wavelength combiner/locker shown in FIG. 2.

Referring to FIG. 6, there is shown a diagram of a fourth embodiment of the integrated wavelength combiner/locker 201d. In this embodiment, the integrated wavelength combiner/locker 201d is associated with an optical vestigial side band transmitter. Details about an optical vestigial side band transmitter can be found in a commonly owned U.S. patent application Ser. No. 10/173,378 filed on Jun. 17, 2002 and entitled "Optical Vestigial Sideband Transmitter/Receiver". This patent application is incorporated by reference herein.

The integrated wavelength combiner/locker 201d is very similar to integrated wavelength combiner/lockers 201a, 201b and 201c except that the positions of the pairs of photodetectors 610 in this embodiment are different than the positions of the pairs of photodetectors 310, 410 and 510 in the previous embodiments. As shown in the aforementioned integrated wavelength combiner/lockers 201a, 201b and 201c the ideal wavelength of the optical signals 232 is centered between each pair of photodetectors 310, 410 and 510 (see "+" on graphs in FIGS. 3–5). However, in this embodiment the wavelengths of the lasers 122 are offset from the center of the passbands of their respective channels causing them to be attenuated by approximately 3 dB relative to the point of minimum insertion loss in order to suppress the unwanted side band to a vestige of its original strength. In this embodiment, the necessary offset in wavelength is accomplished by introducing an offset in the center position of each pair of photodetectors 610. The offset in the wavelength of each laser causes the passbands of the wavelength combiner to substantially attenuate one of the sidebands to a vestige of its original strength. It should be noted that the integrated wavelength combiner/locker 201d may utilize different types of wavelength combiners 204b and 204c besides the illustrated reflective diffraction grating based wavelength combiner 204a.

It should also be noted that the different embodiments of the integrated wavelength combiner/lockers 201 can use other types of wavelength combiners in addition to the aforementioned wavelength combiners 204a, 204b and 204c. It should further be noted that the wavelength combiner 204 may also incorporate a wavelength splitter 214.

It should also be noted that the different embodiments of the integrated wavelength combiner/locker may utilize different types of adjustable wavelength lasers. The wavelength of the lasers may be adjusted by means other than the temperature adjustments described in the illustrated embodiments. This invention simply requires that the wavelength of the laser be adjustable and is not dependent on the specific technique used to adjust the wavelength.

It should also be noted that the different embodiments of the integrated wavelength combiner/locker may also utilize components which are themselves integrated. For example, the thermo-electric cooler, laser, and external modulator may all be integrated into a single package.

It should also be noted that the different embodiments of the integrated wavelength combiner/locker may utilize modulated optical sources other than the laser and external modulator described in the illustrated embodiments. For example, the integrated wavelength combiner/locker could just as easily utilize a directly modulated laser (switched on and off directly by the data source) as long as the wavelength of the laser is adjustable. The externally modulated laser was included in the described embodiments for illustrative purposes only.

Following is a list of some of the advantages associated with the present invention:

The close proximity of the photodetectors allows the ordered-pairs within the photodetector array to be fabricated on the same semiconductor die. This eliminates most errors imposed by photodetector aging thus enhancing the response and sensitivity of the photodetector.

The utilization of the same optical components in the integrated wavelength combiner/locker 201 helps eliminate errors caused by material variations that exist when different optical components are used to make separate wavelength combiners and wavelength lockers.

When used to construct a vestigial side band transmitter, the integrated wavelength combiner/locker 201 permits the use of less-expensive EA-modulated lasers instead of the more expensive Lithium-Niobate modulated lasers with no significant loss in performance.

The integrated wavelength combiner/locker 201 enables enhanced wavelength accuracy which enables more OADM/OADX stages without O-E-O regeneration.

The integrated wavelength combiner/locker 201 can be easily produced by adding a partially reflective device and a set of ordered pairs of photodetectors within a wavelength combiner.

The integrated wavelength combiner/locker 201 as described above makes it easier to stabilize or control the wavelengths of the lasers.

Although four embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. An integrated wavelength combiner/locker, comprising:
    a filter that receives a plurality of optical signals and outputs a multiplexed optical signal;
    a partially reflective device that directs a portion of the multiplexed optical signal back into said filter that splits the multiplexed optical signal into individual optical signals; and
    a plurality of pairs of photodetectors, each pair of photodetectors receives one of the individual optical signals and is used to detect a wavelength error in the one individual optical signal.

2. The integrated wavelength combiner/locker of claim 1, wherein each photodetector of a pair of photodetectors is positioned on either side of a region of maximum constructive interference which corresponds to an ideal wavelength value of one of the individual optical signals.

3. The integrated wavelength combiner/locker of claim 2, wherein one pair of photodetectors outputs two substantially equal electrical signals when there is little if any wavelength error in one of the individual optical signals.

4. The integrated wavelength combiner/locker of claim 2, wherein one pair of photodetectors outputs two different electrical signals when there is a wavelength error in one of the individual optical signals.

5. The integrated wavelength combiner/locker of claim 1, wherein said filter is a diffraction grating or a glass plate.

6. An optical source, comprising:
    at least one transmitter, wherein each transmitter is used to transmit a modulated optical signal to
    an integrated wavelength combiner/locker, wherein said integrated wavelength combiner/locker includes:
        a filter that receives a plurality of the modulated optical signals and outputs a multiplexed optical signal;
        a partially reflective device that directs a portion of the multiplexed optical signal back into said filter that splits the multiplexed optical signal into individual optical signals; and
        a plurality of pairs of photodetectors, each pair of photodetectors receives one of the individual optical signals and is used to detect a wavelength error in the one individual optical signal; and
    a feedback circuit coupled to each tunable laser and said integrated wavelength combiner/locker.

7. The optical source of claim 6, wherein each transmitter includes a tunable laser directly modulated by a data source and used to transmit a modulated optical signal to said integrated wavelength combiner/locker.

8. The optical source of claim 6, wherein each transmitter includes a tunable laser coupled to a modulator both of which are used to transmit a modulated optical signal to said integrated wavelength combiner/locker.

9. The optical source of claim 6, wherein each photodetector of a pair of photodetectors is positioned on either side of a region of maximum constructive interference which corresponds, to an ideal wavelength value of one of the individual optical signals.

10. The optical source of claim 9, wherein one pair of photodetectors outputs two substantially equal electrical signals when there is little if any wavelength error in one of the individual optical signals.

11. The optical source of claim 9, wherein one pair of photodetectors outputs two different electrical signals when there is a wavelength error in one of the individual optical signals.

12. The optical source of claim 11, wherein said feedback circuit utilizes the two different electrical signals received from one pair of photodetectors to substantially correct the wavelength error in one of the individual optical signals by adjusting the corresponding tunable laser.

13. The optical source of claim 6, wherein said filter is a diffraction grating or a glass plate.

14. The optical source of claim 6, wherein said partially reflective device is a mirror or a coupler/circulator.

15. The optical source of claim 6, wherein a portion of the multiplexed optical signal not reflected back into the filter is transmitted in a dense wavelength division multiplexing system.

16. A method for incorporating a wavelength locker within a wavelength combiner, said method comprising the steps of:
    adding a partially reflective device within said wavelength combiner; and
    adding a plurality of pairs of photodetectors within said wavelength combiner, wherein said partially reflective device directs a portion of a multiplexed optical signal into a filter located within said wavelength combiner that splits a multiplexed optical signal into individual optical signals each of which are directed towards one of the pairs of photodetectors which is used to detect a wavelength error in one of the individual optical signals.

17. The method of claim 16, wherein said wavelength combiner is a reflective diffraction grating based wavelength combiner.

18. The method of claim 16, wherein said wavelength combiner also incorporates a wavelength splitter.

19. A method for stabilizing at least one thermally tunable laser within an optical source, said method comprising the steps of:
    incorporating an integrated wavelength combiner/locker within said optical source, said optical source further includes:
        a feedback circuit coupled to each tunable laser and said integrated wavelength combiner/locker, wherein said integrated wavelength combiner/locker includes a partially reflective device that directs a portion of a multiplexed optical signal into a filter that splits the multiplexed optical signal into individual optical signals each of which are directed towards a pair of photodetectors which is used to detect a wavelength error in one of the individual optical signals; and
    using said feedback circuit which utilizes two electrical signals received from one pair of photodetectors to substantially correct the wavelength error if any in one of the individual optical signals by adjusting the corresponding tunable laser.

20. The method of claim 19, wherein:
    each tunable laser is directly modulated by a data source and used to transmit a modulated optical signal to said integrated wavelength combiner/locker; and said integrated wavelength combiner/locker creates the multiplexed optical signal by combining a plurality of the modulated optical signals.

21. The method of claim 19, wherein:
    each tunable laser is coupled to a modulator both of which are used to transmit a modulated optical signal to said integrated wavelength combiner/locker; and
    said integrated wavelength combiner/locker creates the multiplexed optical signal by combining a plurality of the modulated optical signals.

22. The method of claim 19, wherein said filter is a diffraction grating or a glass plate.

23. The method of claim 19, wherein said partially reflective device is a mirror or a coupler/circulator.

24. The method of claim 19, wherein a plurality of the optical sources are used in a dense wavelength division multiplexing system.

25. An optical source, comprising:
    one or more transmitters for outputting one or more optical signals;
    an integrated wavelength combiner/locker having one or more pairs of photodetectors for detecting a wavelength error in each of the one or more optical signals, wherein each photodetector of a pair of photodetectors is positioned on either side of a region of maximum constructive interference which corresponds to an ideal wavelength value of one of the optical signals; and
    a feedback circuit coupled to each of the one or more transmitters and said integrated wavelength combiner/locker.

26. The optical source of claim 25, wherein each transmitter includes a tunable laser coupled to a modulator both of which are used to transmit one of the optical signals to said integrated wavelength combiner/locker.

27. The optical source of claim 25, wherein said integrated wavelength combiner/locker includes:
    a filter that receives a plurality of the modulated optical signals and outputs a multiplexed optical signal;
    a partially reflective device that directs a portion of the multiplexed optical signal back into said filter that splits the multiplexed optical signal into individual optical signals; and
    wherein each pair of photodetectors outputs two substantially equal electrical signals when there is little if any wavelength error in one of the individual optical signals and outputs two different electrical signals when there is a wavelength error in one of the individual optical signals.

28. The optical source of claim 6, wherein a plurality of the optical sources are used in an optical vestigial sideband system.

29. The method of claim 16, wherein said wavelength combiner is a transmissive grating based wavelength combiner.

30. The method of claim 16, wherein said wavelength combiner is a virtually imaged phased array based wavelength combiner.

31. The method of claim 17, wherein said wavelength combiner is an optical vestigial side band based wavelength combiner.

32. The method of claim 19, wherein a plurality of the optical sources are used in an optical vestigial sideband system.

* * * * *